US005424671A

United States Patent [19]

Höhne et al.

[11] Patent Number: 5,424,671

[45] Date of Patent: Jun. 13, 1995

[54] POWER OUTPUT STAGE HAVING A DARLINGTON-PAIR CIRCUIT FOR SWITCHING AN INDUCTIVE LOAD, ESPECIALLY THE IGNITION COIL OF AN INTERNAL-COMBUSTION ENGINE

[75] Inventors: Gerd Höhne, Ludwigsburg; Hartmut Michel, Reutlingen; Lothar Gademann, Rottenburg/N; Bernd Bodig, deceased, late of Schwieberdingen, all of Germany, by Maria Bodig, heir

[73] Assignee: Robert Bosch GmbH, Stuttgart, Germany

[21] Appl. No.: 30,493

[22] PCT Filed: Sep. 7, 1991

[86] PCT No.: PCT/DE91/00712

§ 371 Date: May 25, 1993

§ 102(e) Date: May 25, 1993

[87] PCT Pub. No.: WO92/05364

PCT Pub. Date: Apr. 2, 1992

[30] Foreign Application Priority Data

Sep. 26, 1990 [DE] Germany ........................ 40 30 418.3

[51] Int. Cl.[6] ........................................... H03K 17/615

[52] U.S. Cl. .................................... 327/483; 327/310; 327/482; 327/488; 327/575

[58] Field of Search .................. 307/254, 299.1, 299.3, 307/315, 542, 547, 549, 555, 557; 327/482, 479, 481, 575, 310, 312, 318, 483, 488

[56] References Cited

U.S. PATENT DOCUMENTS

| | | | |
|---|---|---|---|
| 4,369,380 | 1/1983 | Menniti et al. | 307/315 |
| 4,539,492 | 9/1985 | Michel et al. | 307/315 |
| 4,564,771 | 1/1986 | Flohrs | 307/254 |
| 4,706,222 | 11/1987 | Kwiatkowski et al. | 307/315 |
| 5,038,054 | 8/1991 | Peyre-Lavigne et al. | 307/315 |

*Primary Examiner*—Terry D. Cunningham
*Attorney, Agent, or Firm*—Kenyon & Kenyon

[57] ABSTRACT

A power output stage has a Darlington-pair circuit (11, 12) for switching an inductive load, especially the ignition coil of an internalcombustion engine. In order to predetermine the operating mode of the power output stage, a switch (24) is provided which bridges the base-emitter junction of the Darlington-pair circuit (11, 12), is closed in the event of a quick disconnection of the output stage, and is opened in the event of a voltage-limited disconnection of the output stage. A voltage divider, which consists of at least two resistors (16, 18) and bridges the switching junction of the Darlington-pair circuit (11, 12), is connected by means of its pick-off to the junction point between the switch (24) and the base of the Darlington-pair circuit (11, 12), the switch (24) being connected in parallel with a part (18) of the voltage divider. When the switch (24) is open, the Darlington-pair circuit is consequently raised again upon reaching a lower limiting voltage of, for example, 35 volts over the resistor (16), so that, in the case of driving an ignition coil, a spark-free disconnection is achieved. Only a very few, simple and cheap components are required for this purpose.

13 Claims, 1 Drawing Sheet

POWER OUTPUT STAGE HAVING A DARLINGTON-PAIR CIRCUIT FOR SWITCHING AN INDUCTIVE LOAD, ESPECIALLY THE IGNITION COIL OF AN INTERNAL-COMBUSTION ENGINE

FIELD OF THE INVENTION

The present invention relates to a power output stage having a Darlington-pair circuit for switching an inductive load, especially the ignition coil of an internal-combustion engine.

BACKGROUND OF THE INVENTION

When switching inductive loads using power transistors, the requirement often exists to limit the inductive voltage on the power transistor, or that anywhere on the electronic circuit, to a defined value. For this purpose, a protection element can be connected in a known manner in parallel with the emitter-collector junction of the output transistor. Furthermore, European No. 0,174,473 discloses the connection of a zener diode in parallel with the collector-base junction of the output transistor, which zener diode raises the base of the output transistor on reaching an upper limiting voltage of, in general, over 250 volts.

In specific applications, the requirement furthermore exists to be able to carry out voltage limiting at a second, lower voltage level as well, in order, for example, to be able to reduce the stored energy in an ignition coil to this lower voltage level so that no ignition sparks can occur. This so-called spark-free disconnection is fundamentally necessary when the disconnection of the output stage is not intended to be used for producing an ignition spark. In order to create such voltage limiting at a lower voltage level, in the case of the above-mentioned prior art, a voltage divider is connected in parallel with the collector-emitter junction of the output transistor, a pick-off acting via transistor stages on the base of a preliminary-control transistor. Furthermore, an external switching transistor is connected between the base of the preliminary-control transistor and earth in order to predetermine the disconnection mode. Only when this switching transistor is switched off can the base of the preliminary-control transistor be raised to the voltage limit via the voltage divider and the transistor circuit. A large number of components are required for this purpose in the case of the known circuit, which means a cost outlay which is not inconsiderable.

SUMMARY OF THE INVENTION

The power output stage for controlling an inductive load, according to the principles of the present invention, comprises a Darlington circuit including a preliminary-control transistor and an output transistor. A voltage divider including first and second resistors is coupled to the Darlington circuit. In an embodiment of the power output stage according to the present invention, a decoupling diode and an auxiliary transistor are also coupled to the Darlington circuit.

The power output stage according to the present invention, has the advantage that such voltage limiting to a lower voltage level in order to achieve, for example, spark-free disconnection of an ignition coil can also be implemented with a significantly lower component outlay. The layout is in consequence more cost-effective and can more easily be integrated monolithically. A further advantage is that this arrangement can also be used for power output stages which are not fully integrated and have an integrated Darlington-pair circuit, since there is now no longer any need for access between the transistors of the Darlington-pair circuit.

For temperature compensation, the part of the voltage divider located between the pick-off and the collector of the Darlington-pair circuit expediently has a zener diode which is connected in series with one of the resistors.

For many applications, it is expedient or necessary to decouple the divider pick-off from the base of the Darlington-pair circuit. To this end, the pick-off of this voltage divider is connected via at least one decoupling diode to the base of the Darlington-pair circuit.

The raising of the Darlington-pair circuit to the lower limiting voltage can also be carried out, instead of via the input transistor of the Darlington-pair circuit, via an auxiliary transistor whose switching junction bridges the collector-base junction of the output transistor of the Darlington-pair circuit and whose base is connected to the pick-off of the voltage divider.

The described arrangement can also be used in an advantageous manner in order to activate auxiliary functions on reaching the lower limiting voltage. Provided for this purpose on the emitter-side part of the voltage divider is an auxiliary function circuit of which one circuit part is a component of the voltage divider or by means of which a partial voltage of the voltage divider is picked off. Such an auxiliary function circuit is, for example, a circuit for disconnecting the current regulation, a circuit for producing information on interference, or the like.

The auxiliary function circuit can expediently likewise be constructed as a monolithically integrated circuit, especially together with the power output stage.

In addition to voltage limiting to the lower limiting voltage, voltage limiting for a higher voltage level can, of course, also still be provided in order to protect the electronic components, especially the Darlington-pair circuit. For this purpose, a zener diode bridges the collector-emitter junction of the output transistor of the Darlington-pair circuit.

DETAILED DESCRIPTION

Figure 1:
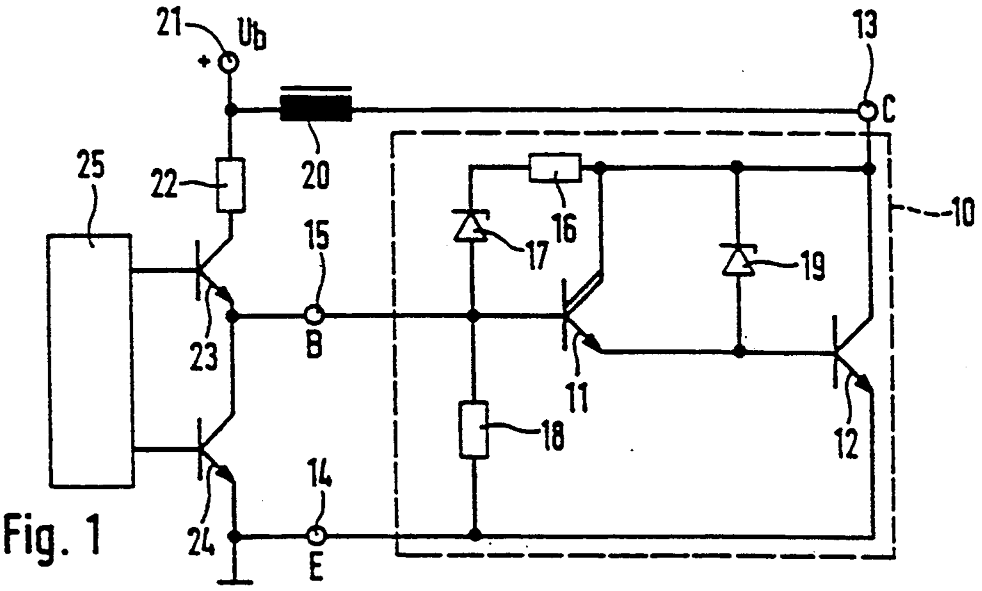
FIG. 1 shows a circuit diagram of a first exemplary embodiment of the power output stage having external circuitry.

In the first exemplary embodiment, shown in FIG. 1, a power output stage 10, at least a portion of which can be constructed in a monolithically integrated manner, consists essentially of a Darlington-pair circuit, which consists of an npn-preliminary-control transistor 11 and an npn-output transistor 12. In this case, the emitter of the preliminary-control transistor 11 is connected in a known manner to the base of the output transistor 12, and the interconnecting collectors of the two transistors 11, 12 form the collector connection (C) 13 of the Darlington-pair circuit and of the power output stage 10. The emitter of the output transistor 12 is connected to an emitter connection (E) 14 and the base of the preliminary-control transistor 11 is connected to a base connection (B) 15 of the Darlington-pair circuit and of the power output stage 10.

The collector connection 13 and the base connection 15 are connected to a zener diode 17 via the series circuit of a resistor 16. A resistor 18 connects the base connection 15 to the emitter connection 14. The resistors 16, 18, together with the zener diode 17, form a voltage divider to which the collector-emitter voltage of the Darlington-pair circuit is applied. A zener diode 19 is connected between the base of the output transistor 12 and the collector connection 13. As the external circuitry of the power output stage 10, the collector connection 13 is connected via the primary winding of an ignition coil 20 for an ignition system of an internal-combustion engine to the positive terminal 21 of a voltage supply source, which exhibits the supply voltage Ub. Furthermore, the series circuit of a resistor 22 and the switching junctions of two transistors 23, 24 is connected between the positive terminal 21 and the negative terminal of the supply voltage source, which is constructed as an earth terminal. The junction point between the two transistors 23, 24 is in this case connected to the base connection 15, while the earth-side connection of the transistor 24 is connected to the emitter connection 14. The two transistors 23, 24 are controlled by an electronic control device 25 which, in the present case, is an ignition control device which is constructed, for example, as a microcomputer.

The power output stage 10 can, of course, also be used for controlling other inductive loads.

In the normal operating mode, the transistor 23 is switched on and the transistor 24 is switched off during the time when the current is flowing through the ignition coil 20. Consequently, the Darlington-pair circuit is raised and ensures the current flow through the primary winding of the ignition coil 20. At the time of ignition, the control of the two transistors 23, 24 is reversed, that is to say the transistor 23 is switched off and the transistor 24 is switched on. Consequently, the Darlington-pair circuit is disconnected very quickly, which is used for producing an ignition spark.

The zener diode 19 is also used for voltage limiting in the normal mode. For this purpose, this zener diode 19 fixes a clamping voltage of, for example, more than 250 volts. Upon reaching this voltage, a breakdown occurs, by means of which the output transistor 12 is switched on again in order to reduce the voltage. Both transistors 23, 24 are switched off simultaneously for so-called spark-free disconnection. Consequently, the Darlington-pair circuit is also initially switched off, so that a voltage rise occurs as a function of the induction. The rising voltage between the collector connection 13 and the emitter connection 14 is simultaneously present on the voltage divider 16–18. The latter is dimensioned such that, in the event of a specific voltage of, for example, 35 volts, the current flowing through the resistor 16 raises the preliminary-control transistor 11 and, via this, the output transistor 12 again. Since the transistor 24 is switched off, this current can now, specifically, not flow away to earth. Consequently, the voltage is limited to the value set by means of the voltage divider, which value is so low that no ignition sparks can occur. The zener diode 17 is used for temperature compensation and can also be omitted in a simpler embodiment.

The voltage limiting takes place when:

$$U_{CE}=2\ U_{BE}(1+R_{16}/R_{18})+U_k$$

In this case, $U_{CE}$ is the collector-emitter voltage and $U_{BE}$ the base-emitter voltage of the Darlington-pair circuit, while $U_k$ is the voltage dropped across the zener diode 17. This condition is valid for a single-stage preliminary-control transistor 11. The latter can, of course, also be constructed with a plurality of stages, as is shown in FIG. 1.

Figure 2:
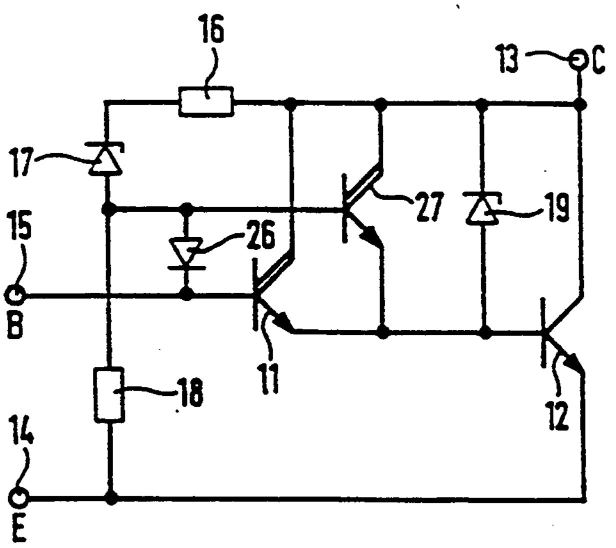
FIG. 2 shows a circuit diagram of a second exemplary embodiment having an auxiliary transistor for voltage limiting to the lower limiting voltage.
Figure 3:
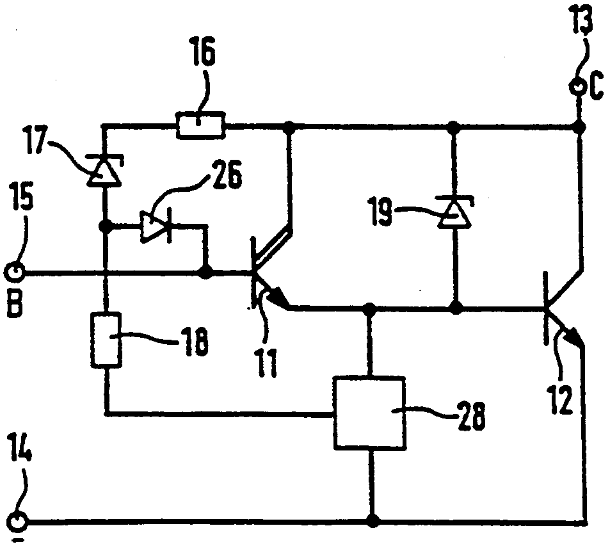
FIG. 3 shows a circuit diagram of a third exemplary embodiment having an auxiliary function circuit.

The second exemplary embodiment, shown in FIG. 2, and the third exemplary embodiment, shown in FIG. 3, largely correspond to the first exemplary embodiment, so that identical components, or components having the identical effect, are provided with the same reference symbols and are not described again. In the same way, the external circuitry has been omitted for simplicity, which circuitry, of course, can be constructed again in the same manner as in the first exemplary embodiment.

In the case of the second exemplary embodiment shown in FIG. 2, the difference from the first exemplary embodiment is that the pick-off of the voltage divider 16–18 is not connected directly to the base connection 15, but via a decoupling diode 26. Furthermore, this pick-off is connected to the base of an auxiliary transistor 27, whose switching junction is connected in parallel with the switching junction of the preliminary-control transistor 11.

The raising of the Darlington-pair circuit upon reaching the lower limiting voltage of, for example, 35 volts now no longer takes place via the preliminary-control transistor 11, but via the auxiliary transistor 27. Because of the decoupling diode 26, the base of the preliminary-control transistor 11 is less than the base voltage of the auxiliary transistor 27 by magnitude of the forward voltage of the decoupling diode 26, that is to say the preliminary-control transistor 11 remains switched off when the voltage limiting is used, and only the auxiliary transistor 27 is switched on and, consequently, switches the output transistor 12 on. When, in contrast, the base connection 15 is drawn to earth, that is to say when the external transistor 24 is switched on, the auxiliary transistor 27 is also always switched off, since its base current is dissipated to earth via the decoupling diode 26. The voltage limiting now takes place only upon reaching the high voltage level of, for example, over 250 volts, by means of the zener diode 19.

If the transistors 11, 12 of the Darlington-pair circuit are constructed with a plurality of stages, for example two stages, then, instead of a decoupling diode 26, two such diodes can also be used, in clamping operation at the level of the lower limiting voltage, in order to decouple the preliminary-control transistor 11 even more from the auxiliary transistor 27. The auxiliary transistor 27 can, of course, also be constructed with one or more stages.

In the case of the third exemplary embodiment, shown in FIG. 3, although a decoupling diode 26 is provided in the same way as in the second exemplary embodiment, the auxiliary transistor 27 is, however, omitted. The resistor 18 of the voltage divider is not connected directly to the emitter of the output transistor 12 or to earth, but indirectly via an auxiliary function circuit 28, which is additionally still connected to the emitter of the preliminary-control transistor 11. The auxiliary function circuit 28 represents, for example, a known circuit for disconnection of the current regulation, a circuit for producing information on interference, or the like. By picking-off a part of the voltage dropped across the voltage divider, the respective auxiliary function can be activated when the lower limiting voltage is reached. In this case, the decoupling diode 26 ensures that the auxiliary function comes to bear only when the base connection 15 is isolated from the emitter connection 14, that is to say when the transistor 24 is switched off.

The auxiliary function circuit 28 can be constructed, for example, as a monolithically integrated circuit and, together with the rest of the power output stage, can form a single monolithically integrated circuit.

In order to set the operating modes, with and without voltage limiting, to the lower voltage level, another switching means can be used instead of the transistor 24, by means of which switching means the base connection 15 and the emitter connection 14 can be interconnected or isolated from one another. If, for other application purposes, the voltage limiting is always intended to act at the lower voltage level, the emitter connection 14 must, of course, be continuously isolated from the base connection 15.

It is claimed:

1. A power output stage for controlling an inductive load coupled to the power output stage and a power source, comprising:

a Darlington circuit including a preliminary-control transistor and an output transistor, a collector of the preliminary-control transistor being coupled to a collector of the output transistor, an emitter of the preliminary-control transistor being coupled to a base of the output transistor;

a voltage divider including a first resistor, a first diode, and a second resistor, a first terminal of a series combination of the first resistor and the first diode being coupled to the collector of the preliminary-control transistor, a second terminal of the series combination of the first resistor and the first diode being coupled to a first terminal of the second resistor, a second terminal of the second resistor being coupled to an emitter of the output transistor;

a decoupling diode, a first terminal of the decoupling diode being coupled to a base of the preliminary-control transistor and a second terminal of the decoupling diode being coupled to the second terminal of the series combination of the first resistor and the first diode; and an auxiliary transistor, a collector of the auxiliary transistor being coupled to the collector of the output transistor, an emitter of the auxiliary transistor being coupled to the base of the output transistor, a base of the auxiliary transistor being coupled to the second terminal of the series combination of the first resistor and the first diode, wherein conduction of the power output stage is controlled by a controller coupled between the base of the preliminary-control transistor and the emitter of the output transistor.

2. The power output stage according to claim 1, wherein the collector of the output transistor is coupled to the inductive load.

3. The power output stage according to claim 2, wherein the inductive load is an ignition coil of an internal-combustion engine.

4. The power output stage according to claim 1, wherein the controller includes a switch coupled between the base of the preliminary-control transistor and the emitter of the output transistor, and wherein the switch predetermines an operating mode of the power output stage, such that a rate of disconnection of the power output stage is controlled by a state of the switch.

5. The power output stage according to claim 4, wherein the switch includes a first external transistor.

6. The power output stage according to claim 5, wherein the controller further includes a second external transistor is coupled between the base of the preliminary-control transistor and the power source.

7. The power output stage according to claim 1, wherein at least a portion of the power output stage is constructed as a monolithically integrated circuit.

8. The power output stage according to claim 1, wherein the first diode is a Zener diode.

9. The power output stage according to claim 1, further comprising a Zener diode coupled between the collector and base of the output transistor.

10. The power output stage according to claim 1, wherein the preliminary-control transistor and the output transistor are npn-type transistors.

11. A power output stage for controlling an inductive load coupled to the power output stage and a power source, comprising:

a Darlington circuit including a preliminary-control transistor and an output transistor, a collector of the preliminary-control transistor being coupled to a collector of the output transistor, an emitter of the preliminary-control transistor being coupled to a base of the output transistor;

a voltage divider including a first resistor, a first diode, and a second resistor, a first terminal of a series combination of the first resistor and the first diode being coupled to the collector of the preliminary-control transistor, a second terminal of the series combination of the first resistor and the first diode being coupled to a first terminal of the second resistor;

a decoupling diode, with a first terminal coupled to a base of the preliminary-control transistor and a second terminal coupled to the second terminal of the series combination of the first resistor and the first diode; and an auxiliary function circuit with a first terminal coupled to the base of the output transistor, a second terminal coupled to the emitter of the output transistor, and a third terminal coupled to a second terminal of the second resistor, wherein conduction of the power output stage is controlled by applying a signal to the base of the preliminary-control transistor.

12. The power output stage according to claim 11, wherein the auxiliary function circuit picks-off a voltage dropped across the voltage divider.

13. The power output stage according to claim 11, wherein the auxiliary function circuit is constructed as a monolithically integrated circuit.

* * * * *